United States Patent
Kurz

(10) Patent No.: US 6,426,881 B1
(45) Date of Patent: Jul. 30, 2002

(54) SHIELDING ARRANGEMENT FOR INTER-COMPONENT SHIELDING IN ELECTRONIC DEVICES

(76) Inventor: Arthur A. Kurz, Wildlife Run, New Vernon, NJ (US) 07976

( * ) Notice: Subject to any disclaimer, the term of this patent is extended or adjusted under 35 U.S.C. 154(b) by 0 days.

(21) Appl. No.: 09/679,030

(22) Filed: Oct. 4, 2000

(51) Int. Cl.[7] ............................. H05K 7/14; H05K 9/00
(52) U.S. Cl. ...................... 361/800; 361/799; 361/818; 361/752; 174/35 R
(58) Field of Search .................... 174/35 R, 35 GC; 361/752, 799, 800, 816, 818

(56) References Cited

U.S. PATENT DOCUMENTS

| | | |
|---|---|---|
| 4,370,515 A | 1/1983 | Donaldson |
| 4,661,888 A | 4/1987 | Jewell et al. |
| 5,550,713 A | 8/1996 | Pressler et al. |
| 5,566,055 A | 10/1996 | Salvi, Jr. |
| 5,596,487 A | 1/1997 | Castaneda et al. |
| 5,657,386 A | 8/1997 | Schwanke |
| 5,682,299 A | 10/1997 | Kunert |
| 5,717,577 A | 2/1998 | Mendolia et al. |
| 5,731,964 A | 3/1998 | Kitakubo et al. |
| 5,748,455 A | 5/1998 | Phillips et al. |
| 5,802,458 A | 9/1998 | Van Zeijl et al. |
| 5,867,371 A | 2/1999 | Denzene et al. |
| 6,049,469 A * | 4/2000 | Hood, III et al. ............ 361/818 |

* cited by examiner

Primary Examiner—Jayprakash N. Gandhi
Assistant Examiner—Tuan Dinh
(74) Attorney, Agent, or Firm—Arthur Jacob

(57) ABSTRACT

A shielding gasket is affixed to a shield housing for interposition between the shield housing and a circuit board of an electronic device. The circuit board includes a plurality of electronic components and related circuitry and the arrangement of the shield housing and the shielding gasket provide for inter-component shielding of the plural electronic components from one another, together with corresponding related circuitry, as well as overall shielding of the plural electronic components on the circuit board. To that end, the shielding gasket includes partitions integral with the shielding gasket for extending between the electronic components, the partitions engaging the shield housing such that the shield housing and the partitions complete inter-component shielding of the electronic components and related circuitry from one another.

20 Claims, 4 Drawing Sheets

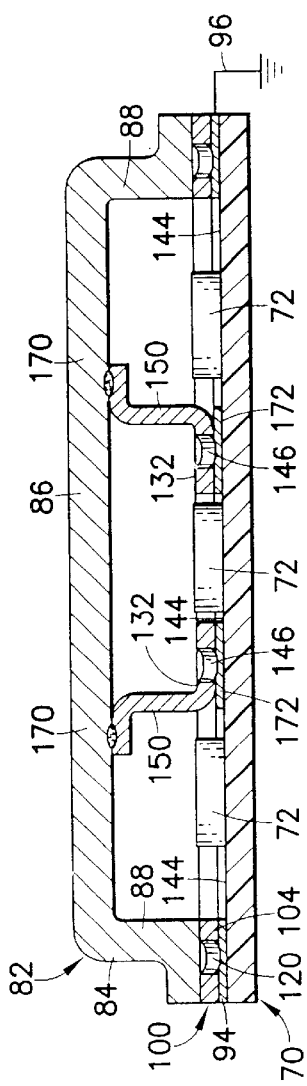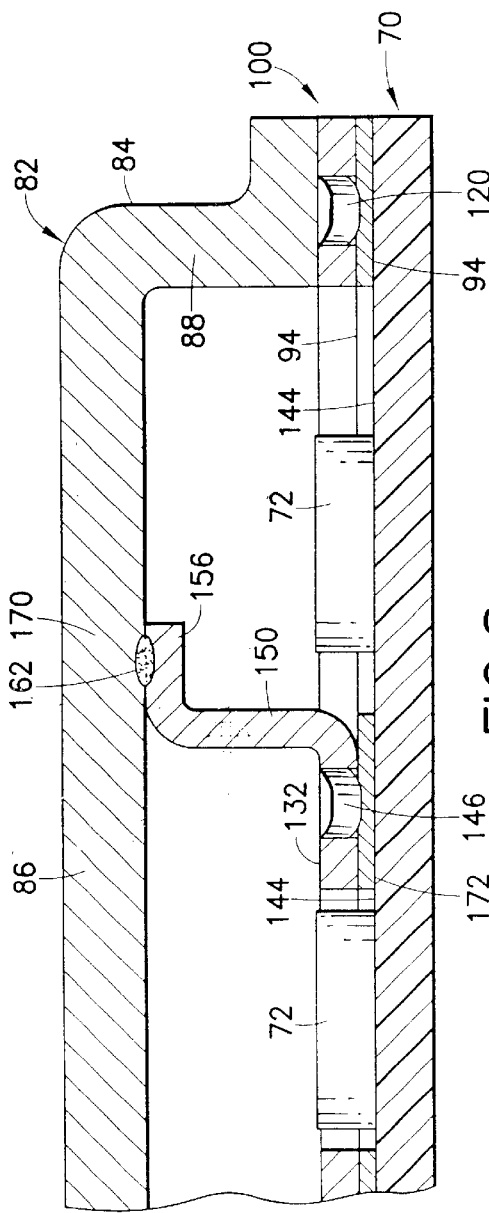

SHIELDING ARRANGEMENT FOR INTER-COMPONENT SHIELDING IN ELECTRONIC DEVICES

BACKGROUND OF THE INVENTION

1. Field of the Invention

The present invention relates generally to shielding arrangements for shielding against electromagnetic and radio frequency interference in electronic devices and pertains, more specifically, to shielding arrangements for providing inter-component shielding between plural electronic components on a circuit board, as well as overall shielding of the electronic components.

2. Description of the Related Art

A wide variety of shielding constructions currently is available for use in connection with electronic equipment such as computers, wireless telephones and various other information and communication devices. These devices very often include circuit boards incorporating electronic components which must be shielded against electromagnetic or radio frequency interference. An effective shielding arrangement currently in use in such devices is a metallic shield, known as a "shielding can", including relatively rigid metallic walls having an outer periphery for surrounding the electronic components to be shielded, the walls of the shield being electrically connected, along the outer periphery of the shield, to a grounding circuit to complete the shielding arrangement. In order to enhance the electrical connection between the walls of the shield and the grounding circuit, shielding gaskets have been developed for interposition between the shield and the grounding circuit, the more effective shielding gaskets being constructed of relatively thin flexible sheets of metal extending along the outer periphery of the shield and including a multiplicity of spring contactors integral with the flexible sheet and establishing effective electrical contact between the shield and the grounding circuit for enhanced shielding performance.

Many of the electronic devices outlined above utilize circuit boards incorporating a plurality of electronic components which themselves must be shielded from one another, as well as being shielded by an overall shielding arrangement. Such inter-component shielding usually is achieved by placing individual supplemental shields, or separate "shielding cans", over each individual electronic component and related circuitry, with all of the individual supplemental shields connected to a grounding circuit for effecting the desired individual, inter-component shielding. The use of these separate, individual supplemental shields requires added effort and expense, as well as added bulk and weight, in the construction of electronic devices.

SUMMARY OF THE INVENTION

The present invention accomplishes inter-component shielding utilizing a shielding construction which attains the enhanced electrical shielding connection provided by a shielding gasket arrangement, while eliminating the necessity for individual supplemental shields placed at each one of plural electronic components and corresponding related circuitry on a circuit board. As such, the present invention attains several objects and advantages, some of which are summarized as follows: Accomplishes inter-component shielding of plural electronic components and related circuitry incorporated in a circuit board without the necessity for individual, supplemental shields placed at each electronic component; reduces bulk and weight in electronic devices which require inter-component shielding among plural electronic components in the devices; reduces manufacturing complexity in the construction of electronic devices which require inter-component shielding among electronic components in the devices; attains enhanced electrical connections between a shielding arrangement and via grounding circuit in electronic devices; reduces the complexity of design and construction in electronic devices, thereby gaining concomitant reductions in cost; reduces the number and complexity of component parts in electronic devices requiring inter-component shielding; facilitates access to shielded plural electronic components and related circuitry for ease of repair; provides an effective shielding arrangement which includes inter-component shielding in a rugged construction capable of exemplary long-term performance.

The above objects and advantages, as well as further objects and advantages, are attained by the present invention which may be described briefly as a shielding gasket for interposition between a shield housing and a circuit board to shield plural electronic components and related circuitry located on the circuit board within corresponding plural discrete areas bounded by given boundaries including area boundaries extending around each discrete area and perimetric boundaries extending around the plural discrete areas, portions of the shield housing being spaced altitudinally from at least some of the given boundaries at predetermined locations along the given boundaries, the shielding gasket establishing inter-component shielding between the plural electronic components and related circuitry within the area boundaries, as well as enhancing overall perimetric shielding of the plural electronic components within the perimetric boundaries, the shielding gasket comprising: a relatively thin, flexible sheet of electrically conductive material; a pattern of strips extending longitudinally and laterally along the sheet, the pattern of strips corresponding to the given boundaries such that the strips are juxtaposed with the given boundaries when the shielding gasket is interposed between the shield housing and the circuit board; a multiplicity of contactors located along each strip and projecting altitudinally from each strip for establishing contact forces to enhance electrical shielding contact between the shield housing and the circuit board, through the shielding gasket, upon interposition of the shielding gasket between the shield housing and the circuit board; and partitions integral with at least some of the strips and extending altitudinally from the strips at prescribed locations corresponding to the predetermined locations for engaging the shield housing at the predetermined locations to complete the inter-component shielding between the plural electronic components and related circuitry upon interposition of the shielding gasket between the shield housing and the circuit board.

Further, the present invention includes a shielding arrangement for assembly with a circuit board to shield plural electronic components and related circuitry located on the circuit board within corresponding plural discrete areas bounded by given boundaries including area boundaries extending around each discrete area and perimetric boundaries extending around the discrete areas, the shielding arrangement comprising: a shield housing having portions for being spaced altitudinally from at least some of the given boundaries at predetermined locations along the given boundaries; a shielding gasket for establishing inter-component shielding between the plural electronic components and related circuitry within the area boundaries, as well as enhancing overall perimetric shielding of the plural electronic components within the perimetric boundaries, the shielding gasket comprising: a relatively thin, flexible sheet of electrically conductive material; a pattern of strips extending longitudinally and laterally along the sheet, the pattern of strips corresponding to the given boundaries such that the strips are juxtaposed with the given boundaries when the shielding gasket is interposed between the shield housing and the circuit board; a multiplicity of contactors located along each strip and projecting altitudinally from each strip for establishing contact forces to enhance electrical shielding contact between the shield housing and the circuit board, through the shielding gasket, upon assembly of the shielding arrangement with the circuit board; and partitions integral with at least some of the strips and extending altitudinally from the strips at prescribed locations corresponding to the predetermined locations, the partitions engaging the shield housing at the predetermined locations to complete the inter-component shielding between the plural electronic components and related circuitry upon assembly of the shielding arrangement with the circuit board.

BRIEF DESCRIPTION OF THE SEVERAL VIEWS OF THE DRAWING

The present invention will be understood more fully, while still further objects and advantages will become apparent, in the following detailed description of preferred embodiments of the invention illustrated in the accompanying drawing, in which:

FIG. 7 is an elevational cross-sectional view of the assembly of FIG. 3, assembled; and FIG. 8 is an enlarged fragmentary view of a portion of FIG. 7.

DETAILED DESCRIPTION OF THE INVENTION

Figure 1:
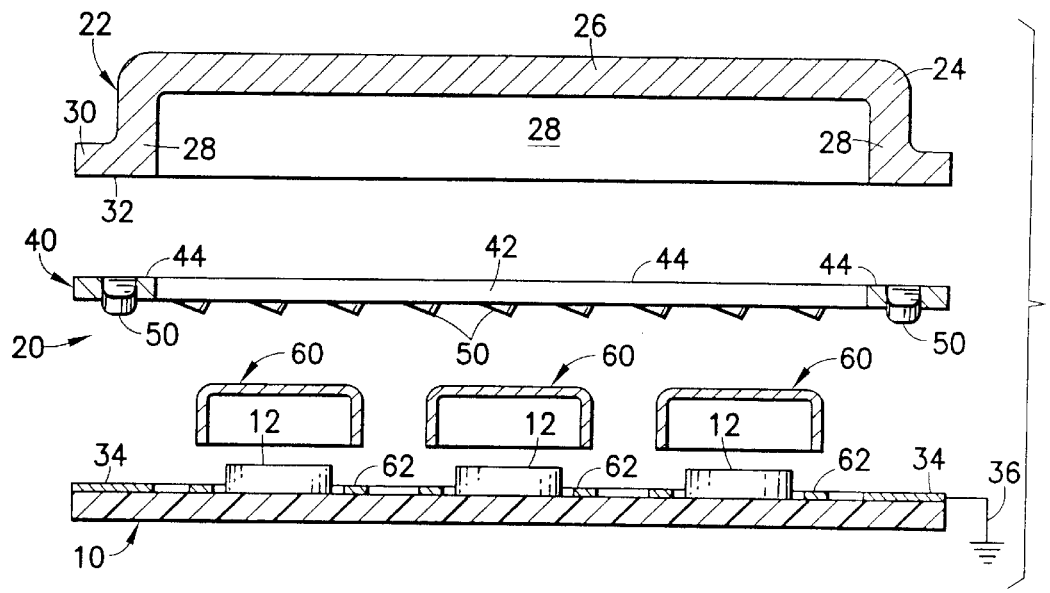
FIG. 1 is an exploded, elevational cross-sectional view showing an assembly utilizing a shielding arrangement constructed in accordance with the prior art.
Figure 2:
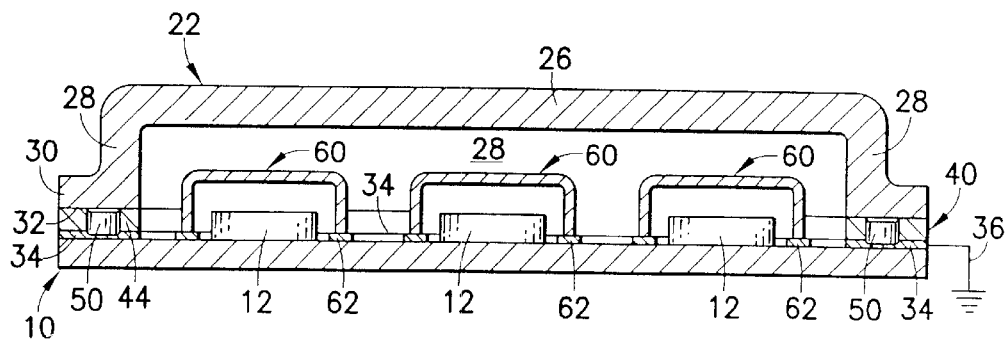
FIG. 2 is an elevational cross-sectional view of the assembly of FIG. 1, assembled.

Referring now to the drawing, and especially to FIGS. 1 and 2 thereof, a conventional shielding arrangement currently in use in connection with electronic devices in which a circuit board 10 includes plural electronic components 12 to be shielded from one another, as well as to be shielded within an overall perimetric shield, is shown at 20. Shielding arrangement 20 includes a shield 22 in the form of a metal shield housing 24 having a generally planar upper wall 26 and peripheral side walls 28 unitary with and depending from the upper wall 26. A rim 30 extends around the periphery of housing 24 and includes an essentially flat basal contact surface 32. The circuit board 10 includes a perimetric trace 34 which is a part of a grounding circuit 36 and is to make intimate electrical connection with the contact surface 32 to complete the desired overall perimetric shielding of the plural electronic components 12.

In order to enhance the electrical connection between the contact surface 32 and the perimetric trace 34, and thereby attain an effective overall shielding arrangement, a shielding gasket 40 is interposed between the rim 30 of the housing 24 and the circuit board 10. The shielding gasket 40 is constructed of a relatively thin and flexible sheet 42 of metallic material and includes strips 44 extending longitudinally and laterally along the sheet 42 to be interposed between the contact surface 32 and the perimetric trace 34. Each strip 44 carries a multiplicity of contactors 50 which are unitary with and project from the strip 44 and, by virtue of the resilient nature of the material of the sheet 42, establish contact forces for enhancing the electrical contact between the contact surface 32 and the trace 34 and, hence, between the housing 24 and the grounding circuit 36. In order to attain inter-component shielding, that is, the shielding of the plurality of electronic components 12 from one another, individual, separate supplemental shields in the form of shielding cans 60 are placed over each electronic component 12 and are connected electrically to the grounding circuit 36, through supplemental traces 62 on the circuit board 10, as by soldering the shielding cans 60 to the supplemental traces 62.

Figure 3:
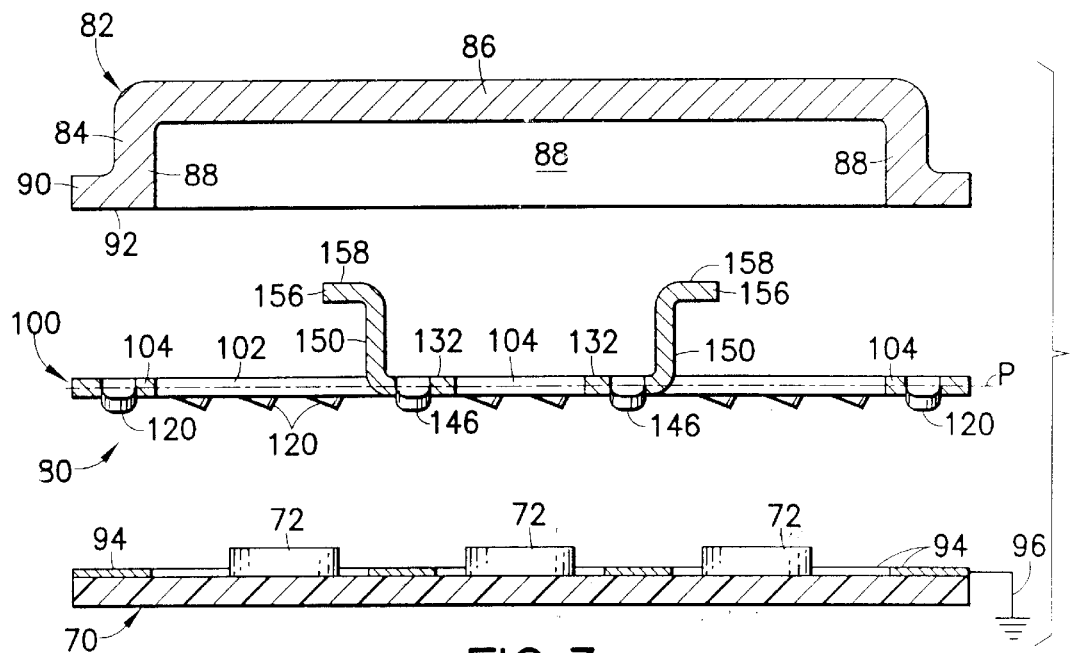
FIG. 3 is an exploded, elevational cross-sectional view showing an assembly utilizing a shielding arrangement constructed in accordance with the present invention.

The present invention eliminates the need for supplemental shields, such as the shielding cans 60, together with the added bulk and weight introduced by such supplemental shields, as well as manufacturing complexities required for the fabrication and installation of the supplemental shields. Turning now to FIG. 3, as before, a circuit board 70 of an electronic device includes a plurality of electronic components 72 which are to be shielded from one another, as well as within an overall perimetric shield, by a shielding arrangement 80 constructed in accordance with the present invention. Shielding arrangement 80 includes a shield 82 in the form of a metal shield housing 84 having a generally planar upper wall 86 and peripheral side walls 88 unitary with and depending from the upper wall 86. A rim 90 extends around the periphery of housing 84 and includes an essentially flat basal contact surface 92. The circuit board 70 includes a perimetric trace 94 which is a part of a grounding circuit 96 and is to make intimate electrical connection with the contact surface 92 to complete the desired overall perimetric shielding of the plural electronic components 72.

In order to enhance the electrical connection between the contact surface 92 and the perimetric trace 94, and thereby attain an effective overall shielding arrangement, a shielding gasket 100 is interposed between the rim 90 of the housing 84 and the circuit board 70. The shielding gasket 100 is constructed of a relatively thin and flexible sheet 102 of metallic material and includes strips 104 extending longitudinally and laterally along the sheet 102 to be interposed between the contact surface 92 and the perimetric trace 94. Each strip 104 carries a multiplicity of contactors 120 which are unitary with and project from the strip 104 and, by virtue of the resilient nature of the material of the sheet 102, establish contact forces for enhancing the electrical contact between the contact surface 92 and the trace 94 and, hence, between the housing 84 and the grounding circuit 96.

Figure 4:
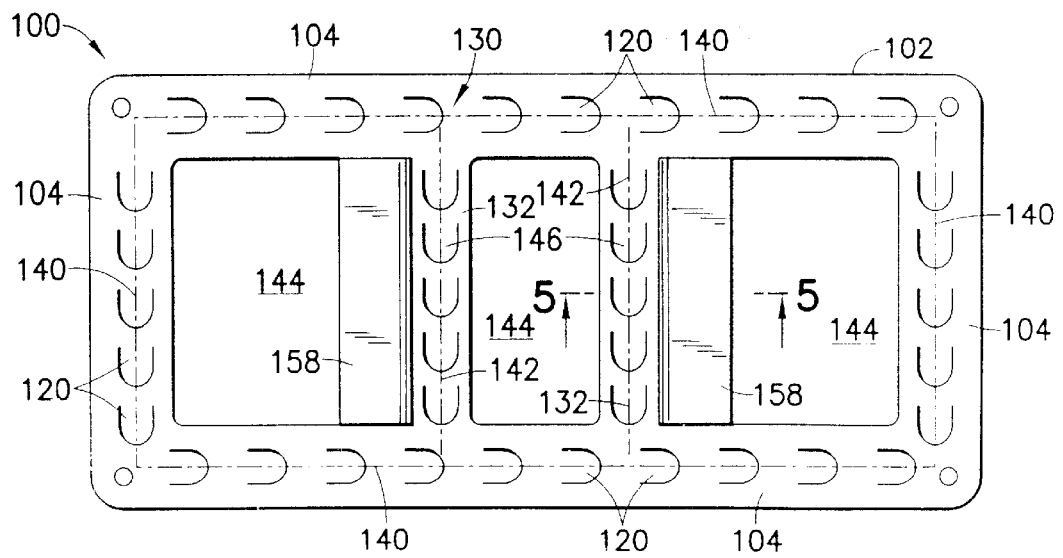
FIG. 4 is a top plan view of a shielding gasket of the assembly shown in FIG. 3.
Figure 5:
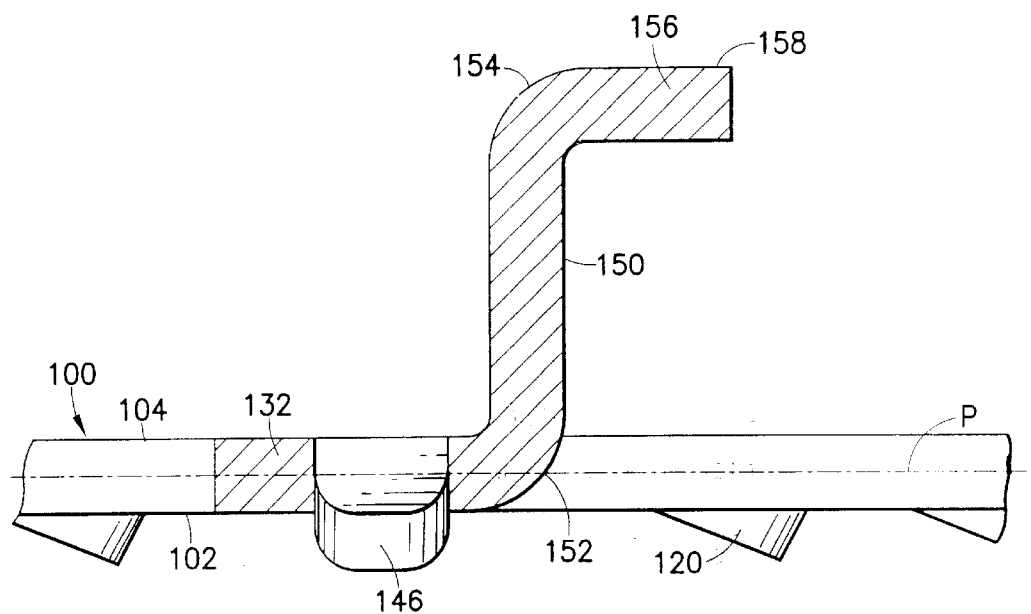
FIG. 5 is an enlarged cross-sectional view taken along line 5—5 of FIG. 4.

As seen in FIGS. 4 and 5, in order to attain inter-component shielding, that is, shielding of the plurality of electronic components 72 from one another, as well as shielding of the circuitry related to each electronic component 72, the sheet 102 is provided with a pattern 130 of strips which includes not only first strips shown in the form of strips 104, but second strips shown in the form of additional strips 132 integral with, and preferably formed unitary with, the sheet 102. Thus, while strips 104 follow perimetric boundaries 140 extending around the circuit board 70, adjacent the perimeter of the circuit board 70, and attain enhanced electrical connection with the perimetric trace 94 for accomplishing the overall perimetric shielding of electronic components 72, the additional strips 132 of pattern 130 follow area boundaries 142 extending along discrete areas 144 within which each electronic component 72 and related circuitry is placed, so that the pattern 130 of strips 104 and 132 corresponds to the given perimetric and area boundaries 140 and 142, and the strips 104 and 132 are juxtaposed, respectively, with boundaries 140 and 142 when the shielding gasket 100 is interposed between the housing 84 and the circuit board 70. The additional strips 132 carry a multiplicity of contactors 146.

Figure 6:
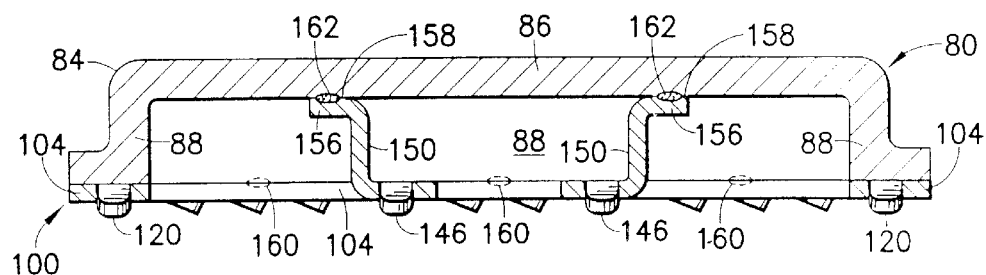
FIG. 6 is an elevational cross-sectional view of component parts of the shielding arrangement, assembled.

Partitions 150 are integral with each additional strip 132 and a extend altitudinally from a near edge 152, at the plane P of the sheet 102, to a far edge 154 remote from the plane P of sheet 102, and a contact foot 156 extends from the partition 150 at the far edge 154. In the preferred embodiment, partitions 150 are unitary with strips 132 and extend perpendicular to the strips 132, while the contact foot 156 is in the form of a continuous flange 158 unitary with the partition 150 and extending normal to the partition 150. The described structure of shielding gasket 100 readily is constructed of a single piece by stamping and forming the structure from a thin sheet of metal, the preferred metal being stainless steel. In the preferred construction, the shielding gasket 100 then is affixed to the housing 84, with the strips 104 juxtaposed with the contact surface 92 of the housing 84, and the flanges 158 of the partitions 150 juxtaposed with the upper wall 86 of the housing 84, as illustrated in FIG. 6. The shielding gasket 100 is secured in place, as by spot welds 160 along the strips 104 and spot welds 162 along the flanges 158.

Upon assembling the shielding arrangement 80 with the circuit board 70, as seen in FIGS. 7 and 8, the shielding gasket 100 is interposed between the housing 84 and the circuit board 70. Portions 170 of the housing 84 are spaced altitudinally from the given perimetric and area boundaries 140 and 142 at predetermined locations along the area boundaries 142 and the partitions 150 are placed at prescribed locations corresponding to the predetermined locations, while the peripheral side walls 88 of the housing 84 are placed at the perimetric boundaries 140. The partitions 150 then extend altitudinally from the circuit board 70 to the upper wall 86 of the housing 84, at portion 170, and, together with surrounding portions of the upper wall 86 and the peripheral side walls 88 of the housing 84, surround the discrete areas 144 to complete the shielding around each electronic component 72 and related circuitry within an area 144. The contactors 146 engage supplemental traces 172 which extend along the circuit board 70 at area boundaries 142 and which are connected to grounding circuit 96. The contactors 120 along the strips 104, now supported by the side walls 88 of the housing 84, and the contactors 146 along the strips 132, now supported by the partitions 150, enhance the electrical contact along the given perimetric and area boundaries 140 and 142, respectively, to establish a shielding arrangement which includes an inter-component shield effective to shield each of the plural electronic components 72 from one another, together with related circuitry, as well as an overall perimetric shield to shield all of the electronic components 72 of the circuit board 70. Since the inter-component shield is established without requiring soldering to the traces 94 or 172, subsequent access to the electronic components 72 and related circuitry for any needed repair is facilitated by merely requiring simple removal of the housing 84 and the shielding gasket 100 from the circuit board 70.

It will be understood that the pattern of strips of a shielding gasket, such as shielding gasket 100, can be varied in accordance with the requirements of the particular layout of the circuitry on any given circuit board, such as circuit board 70, the utilization of integral partitions, such as partitions 150, associated with those strips to be juxtaposed with area boundaries along the discrete areas within which the plural electronic components are located, together with related circuitry, enabling the completion of a shielding arrangement effective to shield the plural electronic components, as well as respective related circuitry, from one another.

It will be seen that the present invention attains the objects and advantages summarized above, namely: Accomplishes inter-component shielding of plural electronic components and related circuitry incorporated in a circuit board without the necessity for individual, supplemental shields placed at each electronic component; reduces bulk and weight in electronic devices which require inter-component shielding among plural electronic components in the devices; reduces manufacturing complexity in the construction of electronic devices which require inter-component shielding among electronic components in the devices; attains enhanced electrical connections between a shielding arrangement and a grounding circuit in electronic devices; reduces the complexity of design and construction in electronic devices, thereby gaining concomitant reductions in cost; reduces the number and complexity of component parts in electronic devices requiring inter-component shielding; facilitates access to shielded plural electronic components and related circuitry for ease of repair; provides an effective shielding arrangement which includes inter-component shielding in a rugged construction capable of exemplary long-term performance.

It is to be understood that the above detailed description of preferred embodiments of the invention is provided by way of example only. Various details of design and construction may be modified without departing from the true spirit and scope of the invention, as set forth in the appended claims.

The embodiments of the invention in which an exclusive property or privilege is claimed are defined as follows:

1. A shielding gasket for interposition between a shield housing and a juxtaposed circuit board to shield plural electronic components and related circuitry located on the circuit board within corresponding plural discrete areas bounded by given boundaries including area boundaries extending around each discrete area and perimetric boundaries extending around the plural discrete areas, the shield housing including contact surfaces for juxtaposition with the circuit board and portions spaced altitudinally from at least some of the given boundaries at predetermined locations along the given boundaries, the shielding gasket establishing inter-component shielding between the plural electronic components and related circuitry within the area boundaries, as well -as enhancing overall perimetric shielding of the plural electronic components within the perimetric boundaries, the shielding gasket comprising:

a relatively thin, flexible sheet of electrically conductive material;

a pattern of strips extending longitudinally and laterally along the sheet, the pattern of strips corresponding to the given boundaries such that the strips are juxtaposed with the given boundaries when the shielding gasket is interposed between the shield housing and the circuit board, the strips including first strips for interposition between the contact surfaces of the shield housing and the circuit board along some of the given boundaries, and second strips for extending along others of the given boundaries;

a multiplicity of contactors located along each strip and projecting altitudinally from each strip for establishing contact forces to enhance electrical shielding contact between the shield housing and the circuit board, through the shielding gasket, upon interposition of the shielding gasket between the shield housing and the circuit board; and partitions integral with the second strips and extending along and altitudinally from the second strips at prescribed locations corresponding to the predetermined locations for engaging the shield housing at the predetermined locations to complete the inter-component shielding between the plural electronic components and related circuitry upon interposition of the shielding gasket between the shield housing and the circuit board.

2. The invention of claim 1 wherein the partitions each extend altitudinally from a near edge integral with the sheet to a far edge remote from the sheet, each partition including a contact foot integral with the partition along the far edge for engagement with the shield housing when the shielding gasket is interposed between the shield housing and the circuit board.

3. The invention of claim 2 wherein the contact foot includes a flange integral with the partition and providing a securing structure for enabling securement of the partition to the shield housing.

4. The invention of claim 1 wherein the partitions are unitary with the sheet.

5. The invention of claim 4 wherein the partitions each extend altitudinally from a near edge integral with the sheet to a far edge remote from the sheet, each partition including a contact foot integral with the partition along the far edge for engagement with the shield housing when the shielding gasket is interposed between the shield housing and the circuit board.

6. The invention of claim 5 wherein the contact foot includes a flange unitary with the partition and providing a securing structure for enabling securement of the partition to the shield housing.

7. A shielding gasket for interposition between a shield housing and a circuit board to shield plural electronic components and related circuitry located on the circuit board within corresponding plural discrete areas bounded by given boundaries including area boundaries extending around each discrete area and perimetric boundaries extending around the plural discrete areas, the circuit board extending essentially within a plane and the shield housing including a generally planar wall for being spaced altitudinally from the circuit board, and peripheral walls extending altitudinally from the planar wall to essentially flat contact surfaces for juxtaposition with the circuit board, portions of the shield housing being spaced altitudinally from at least some of the given boundaries at predetermined locations along the given boundaries, the shielding gasket establishing inter-component shielding between the plural electronic components and related circuitry within the area boundaries, as well as enhancing overall perimetric shielding of the plural electronic components within the perimetric boundaries, the shielding gasket comprising:

a relatively thin, flexible sheet of electrically conductive material;

a pattern of strips extending longitudinally and laterally along the sheet, the pattern of strips corresponding to the given boundaries such that the strips are juxtaposed with the given boundaries when the shielding gasket is interposed between the shield housing and the circuit board;

the strips of the shielding gasket including essentially planar first strips for interposition between the flat contact surfaces and the circuit board along some of the given boundaries and second strips for extending along others of the given boundaries;

a multiplicity of contactors located along each strip and projecting altitudinally from each strip for establishing contact forces to enhance electrical shielding contact between the shield housing and the circuit board, through the shielding gasket, upon interposition of the shielding gasket between the shield housing and the circuit board; and partitions integral with the second strips and extending along and altitudinally from the second strips at prescribed locations corresponding to the predetermined locations for engaging the shield housing at the predetermined locations to complete the inter-component shielding between the plural electronic components and related circuitry upon interposition of the shielding gasket between the shield housing and the circuit board.

8. The invention of claim 7 wherein the second strips are essentially planar and the partitions extend generally normal to the second strips.

9. The invention of claim 8 wherein the partitions each extend altitudinally from a near edge integral with the sheet to a far edge remote from the sheet, each partition including a contact foot integral with the partition along the far edge for engagement with the shield housing when the shielding gasket is interposed between the shield housing and the circuit board.

10. The invention of claim 9 wherein the contact foot includes a flange integral with the partition and providing a securing structure for enabling securement of the partition to the shield housing.

11. The invention of claim 7 wherein the partitions are unitary with the sheet.

12. The invention of claim 11 wherein the second strips are essentially planar and the partitions extend generally normal to the second strips.

13. The invention of claim 12 wherein the contact foot includes a flange integral with the partition and providing a securing structure for enabling securement of the partition to the shield housing.

14. The invention of claim 13 wherein the partitions are unitary with the sheet.

15. A shielding arrangement for assembly with a circuit board to shield plural electronic components and related circuitry located on the circuit board within corresponding plural discrete areas bounded by given boundaries including area boundaries extending around each discrete area and perimetric boundaries extending around the discrete areas, the shielding arrangement comprising:

a shield housing having contact surfaces for juxtaposition with the circuit board and portions for being spaced altitudinally from at least some of the given boundaries at predetermined locations along the given boundaries upon juxtaposition of the shield housing with the circuit board;

a shielding gasket for establishing inter-component shielding between the plural electronic components and related circuitry within the area boundaries, as well as enhancing overall perimetric shielding of the plural electronic components within the perimetric boundaries, the shielding gasket comprising:

a relatively thin, flexible sheet of electrically conductive material;

a pattern of strips extending longitudinally and laterally along the sheet, the pattern of strips corresponding to the given boundaries such that the strips are juxtaposed with the given boundaries when the shielding gasket is interposed between the shield housing and the circuit board, the strips including first strips for interposition between the contact surfaces of the shield housing and the circuit board along some of the-given boundaries, and second strips for extending along others of the given boundaries;

a multiplicity of contactors located along each strip and projecting altitudinally from each strip for establishing contact forces to enhance electrical shielding contact between the shield housing and the circuit board, through the shielding gasket, upon assembly of the shielding arrangement with the circuit board; and partitions integral with the second strips and extending along and altitudinally from the second strips at prescribed locations corresponding to the predetermined locations, the partitions engaging the shield housing at the predetermined locations to complete the inter-component shielding between the plural electronic components and related circuitry upon assembly of the shielding arrangement with the circuit board.

16. The invention of claim 15 wherein the partitions each extend altitudinally from a near edge integral with the sheet to a far edge remote from the sheet, each partition including a contact foot integral with the partition along the far edge and engaged with the shield housing.

17. The invention of claim 16 wherein the contact foot includes a flange integral with the partition and securing the partition to the shield housing.

18. The invention of claim 17 wherein the partitions are unitary with the sheet.

19. A shielding arrangement for assembly with a circuit board to shield plural electronic components and related circuitry located on the circuit board within corresponding plural discrete areas bounded by given boundaries including area boundaries extending around each discrete area and perimetric boundaries extending around the discrete areas, the circuit board extending essentially within a plane, the shielding arrangement comprising:

a shield housing having a generally planar wall for being spaced altitudinally from the circuit board, peripheral walls extending altitudinally from the planar wall to essentially flat contact surfaces for juxtaposition with the circuit board, and portions for being spaced altitudinally from at least some of the given boundaries at predetermined locations along the given boundaries;

a shielding gasket for establishing inter-component shielding between the plural electronic components and related circuitry within the area boundaries, as well as enhancing overall perimetric shielding of the plural electronic components within the perimetric boundaries, the shielding gasket comprising:

a relatively thin, flexible sheet of electrically conductive material;

a pattern of strips extending longitudinally and laterally along the sheet, the pattern of strips corresponding to the given boundaries such that the strips are juxtaposed with the given boundaries, the strips of the shielding gasket including essentially planar first strips affixed to the flat contact surfaces for juxtaposition between the contact surfaces and the circuit board along some of the given boundaries and second strips for extending along others of the given boundaries, when the shielding gasket is interposed between the shield housing and the circuit board;

a multiplicity of contactors located along each strip and projecting altitudinally from each strip for establishing contact forces to enhance electrical shielding contact between the shield housing and the circuit board, through the shielding gasket, upon assembly of the shielding arrangement with the circuit board; and partitions unitary with the second strips and extending along and altitudinally from the second strips at prescribed locations corresponding to the predetermined locations, the partitions engaging the shield housing at the predetermined locations to complete the inter-component shielding between the plural electronic components and related circuitry upon assembly of the shielding arrangement with the circuit board;

the partitions each extending altitudinally from a near edge integral with the sheet to a far edge remote from the sheet, each partition including a contact foot integral with the partition along the far edge and engaged with the shield housing, the contact foot including a flange integral with the partition and securing the partition to the shield housing.

20. The invention of claim 19 wherein the second strips are essentially planar and the partitions extend generally normal to the second strips.

* * * * *